United States Patent
Weichmann et al.

(10) Patent No.: US 10,641,695 B2
(45) Date of Patent: May 5, 2020

(54) METHOD OF DETERMINING OPERATION CONDITIONS OF A LASER-BASED PARTICLE DETECTOR

(71) Applicant: Philips Photonics GmbH, Ulm (DE)

(72) Inventors: Ulrich Weichmann, Eindhoven (NL); Joachim Wilhelm Hellmig, Eindhoven (NL); Alexander Marc Van Der Lee, Eindhoven (NL); Holger Joachim Moench, Eindhoven (NL)

(73) Assignee: TRUMPF PHOTONIC COMPONENTS GMBH, Ulm (DE)

( * ) Notice: Subject to any disclaimer, the term of this patent is extended or adjusted under 35 U.S.C. 154(b) by 0 days.

(21) Appl. No.: 16/558,184

(22) Filed: Sep. 2, 2019

(65) Prior Publication Data

US 2019/0383717 A1 Dec. 19, 2019

Related U.S. Application Data

(63) Continuation of application No. PCT/EP2018/054853, filed on Feb. 28, 2018.

(30) Foreign Application Priority Data

Mar. 2, 2017 (EP) .................... 17158808

(51) Int. Cl.
*G01N 15/02* (2006.01)
*G01N 15/14* (2006.01)
*H01S 5/183* (2006.01)

(52) U.S. Cl.
CPC ......... *G01N 15/0205* (2013.01); *G01N 15/14* (2013.01); *H01S 5/183* (2013.01); *G01N 2015/1493* (2013.01)

(58) Field of Classification Search
CPC .................................................. G01N 15/0205
(Continued)

(56) References Cited

U.S. PATENT DOCUMENTS

2010/0134803 A1* 6/2010 Baier ..................... H01S 5/187
356/498
2012/0002189 A1* 1/2012 Bengoechea Apezteguia ............
G01F 1/661
356/28.5

(Continued)

FOREIGN PATENT DOCUMENTS

| DE | 102015207289 A1 | 10/2016 |
| WO | WO 0237410 A1 | 5/2002 |
| WO | WO 2017016888 A1 | 2/2017 |

OTHER PUBLICATIONS

Ranveer S Matharu et al: "Influence of ambient temperature on the performance of VCSEL based self-mixing sensors: Flow measurements", 2011 IEEE Sensors Proceedings, Oct. 28-31, 2011, pp. 1100-1103, XP032093158.

(Continued)

*Primary Examiner* — Tarifur R Chowdhury
*Assistant Examiner* — Omar H Nixon
(74) *Attorney, Agent, or Firm* — Leydig, Voit & Mayer, Ltd.

(57) ABSTRACT

A method for determining operating conditions of a particle detector that includes a multimode Vertical Cavity Surface Emitting Laser (VCSEL) includes providing an electrical drive current to the multimode VCSEL such that a laser beam is emitted by the multimode VCSEL and varying the electrical drive current within a predefined range of electrical drive currents. The method further includes determining, as a function of the electrical drive current, an intensity signal of an optical wave within a laser cavity of the multimode VCSEL, determining, as a function of the elec- (Continued)

trical drive current, a noise measure of the intensity signal, determining a range of electrical drive currents for which the noise measure is below a predefined threshold noise measure value, and determining operating conditions of the particle detector by choosing an electrical drive current for particle detection out of the determined low noise range of electrical drive currents.

14 Claims, 3 Drawing Sheets

(58) Field of Classification Search
USPC .......................................................... 356/338
See application file for complete search history.

(56) References Cited

U.S. PATENT DOCUMENTS

2013/0120759 A1* 5/2013 Van Der Lee .......... G01S 7/497
356/498
2014/0368832 A1* 12/2014 Salvade ................. G01B 5/008
356/497
2016/0313243 A1 10/2016 Dittrich et al.

OTHER PUBLICATIONS

Ranveer S Matharu et al: "Temperature and current dependence of Doppler SNR in a VCSEL based self-mixing sensor", Sensors, Oct. 25, 2009 (Oct. 25, 2009), pp. 425-428, XP031618667.

* cited by examiner

METHOD OF DETERMINING OPERATION CONDITIONS OF A LASER-BASED PARTICLE DETECTOR

CROSS REFERENCE TO RELATED APPLICATIONS

This application is a continuation of International Application No. PCT/EP2018/054853 (WO 2018/158276 A1), filed on Feb. 28, 2018, and claims benefit to European Patent Application No. EP 17158808.0, filed Mar. 2, 2017, both of which are incorporated by reference herein.

FIELD

The invention relates to a method of determining operation conditions of a laser-based particle detector. The invention further relates to a particle detector and a mobile device comprising such a particle detector. The invention additionally relates to a related computer program product.

BACKGROUND

DE 10 2015 207 289 A1 discloses a particle sensor apparatus having an optical emitter device that is configured to emit an optical radiation so that a volume having at least one particle possibly present therein is at least partly illuminable; an optical detector device having at least one detection surface that is struck by at least a portion of the optical radiation scattered at the at least one particle, at least one information signal regarding an intensity and/or an intensity distribution of the optical radiation striking the at least one detection surface being displayable; and an evaluation device with which an information item regarding a presence of particles, a number of particles, a particle density, and/or at least one property of particles is identifiable and displayable, the particle sensor apparatus also encompassing at least one lens element that is disposed so that the emitted optical radiation is focusable onto a focus region inside the volume.

WO 2017/016888 A1 discloses a laser sensor module for particle density detection. The laser sensor module comprising at least one first laser, at least one first detector and at least one electrical driver. The first laser is adapted to emit first laser light in reaction to signals provided by the at least one electrical driver. The at least one first detector is adapted to detect a first self-mixing interference signal of an optical wave within a first laser cavity of the first laser. The first self-mixing interference signal is caused by first reflected laser light reentering the first laser cavity, the first reflected laser light being reflected by a particle receiving at least a part of the first laser light.

SUMMARY

In an embodiment, the present invention provides a method for determining operating conditions of a particle detector for detecting a particle density of particles with a size of less than 20 µm in a fluid, wherein the particle detector include a multimode Vertical Cavity Surface Emitting Laser (VCSEL). The method includes providing an electrical drive current to the multimode VCSEL such that a laser beam is emitted by the multimode VCSEL and varying the electrical drive current within a predefined range of electrical drive currents. The method further includes determining, as a function of the electrical drive current, an intensity signal of an optical wave within a laser cavity of the multimode VCSEL, determining, as a function of the electrical drive current, a noise measure of the intensity signal, and determining a range of electrical drive currents for which the noise measure is below a predefined threshold noise measure value. In addition, the method includes determining at least a part of the operating conditions of the particle detector by choosing an electrical drive current for particle detection out of the determined low noise range of electrical drive currents, detecting a trigger event during operation of the particle detector, and determining the noise measure of the intensity signal of the optical wave within the laser cavity of the multimode VCSEL during operation of the particle detector. Furthermore, the method includes determining a new range of electrical drive currents if the noise measure of the intensity signal of the optical wave within the laser cavity during operation of the particle detector exceeds an operating threshold and determining at least a part of the operating conditions of the particle detector by choosing, from the new range of electrical drive currents, a new electrical drive current for particle detection.

BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following.

DETAILED DESCRIPTION

Figure 1:
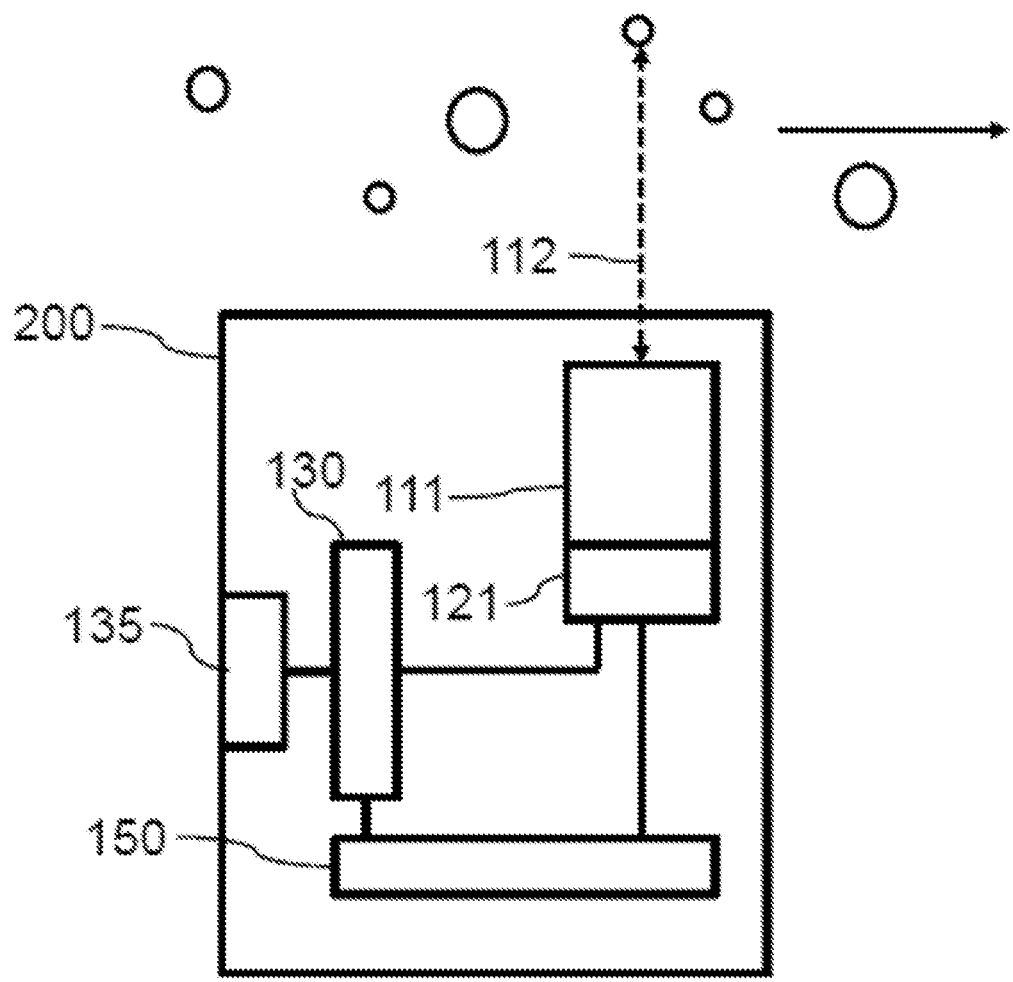
FIG. 1 shows a principal sketch of a particle detector.

Embodiments of the invention provide particle detectors and methods of determining operation conditions of a particle detector that enable more reliable particle detection.

According to a first aspect of the invention, a method of determining operation conditions of a laser-based particle detector for detecting a particle density of particles with a size of less than 20 µm, preferably less than 10 µm in a fluid is proposed. The particle detector comprises a laser. The laser is a multimode Vertical Cavity Surface Emitting Laser (VCSEL). The method comprises the steps of: providing an electrical drive current to the laser such that a laser beam is emitted by the laser, varying the drive current within a predefined range of drive currents, determining an intensity signal of an optical wave within a laser cavity of the laser as a function of the drive current, determining a noise measure of the intensity signal as a function of the drive current, determining a range of drive currents in which the noise measure is below a predefined threshold value, and determining at least a part of the operation conditions of the particle detector by choosing a drive current for particle detection out of the determined range of drive currents.

VCSELs with detectors like, for example, integrated photodiodes (ViP) are commonly used as sensors for the measurement of distances, displacements, or velocities, based on the principle of self-mixing interference (SMI). A relatively new application of this type is the measurement of particle detection and especially particle densities, which enables, for example, a measurement of air quality. Devices of this type might be simple and small enough to be even integrated in mobile phones.

Single-mode VCSELs may be used for particle detection by way of self-mixing interference measurements because of the reliable operation characteristics of single-mode VCSELs. Single-mode VCSELs requires however the use of relatively small active diameters of the VCSEL in the order of 2-3 µm, which leads to several difficulties and disadvantages, such as very tight production tolerances with respect to the active diameter, limited reliability due to the high current densities and a reduced efficiency as compared with multimode VCSELs. Multimode VCSELs do have the disadvantage that operation characteristics may change depending on, for example, ambient temperature, operation temperature of the VCSEL, aging of the VCSEL, production spread of the VCSEL etc.

The proposed method enables the use of a multimode VCSEL especially in cw-operation for particle detection. A multimode VCSEL is characterized in that the VCSEL can be driven such that different dominant optical modes are present in the laser cavity depending on the operation conditions. The active diameter of a multimode VCSEL is usually bigger than 3 µm especially bigger than 4 µm.

The detector may be any measurement device suited to determine the intensity signal of the optical mode(s) in the laser cavity like, for example, an integrated photodiode or an impedance measurement device configured to measure the impedance across the laser cavity.

The detector detects intensity noise or an intensity signal which may, for example, correspond to a change of the optical mode(s) within the laser cavity (mode hoping). The intensity signal provides a noise measure which can be used to determine reliability of the operation conditions of the multimode VCSEL. A reliable operation of the VCSEL and therefore reliable particle detection may be enabled as soon as the noise measure is below a predefined threshold value. The intensity signal may, for example, correspond to the self-mixing interference signal within the laser cavity. The noise measure may, for example, correspond to the inverse of the signal-to-noise ratio of the self-mixing interference signal within the laser cavity. It has to be emphasized that the measurement signal of the self-mixing interference signal and therefore the signal-to-noise ratio is not needed in order to get a noise measure indicating reliability of driving conditions of the VCSEL comprised by the particle detector.

The range of drive currents may be determined as a function of ambient temperature. The drive current for particle detection is chosen depending on an ambient temperature during particle detection. The ambient temperature may have an influence with respect to the operation conditions of the VCSEL. The range of drive currents may therefore be determined for different ambient temperatures and corresponding measurement data may be stored in a storing device. The drive current of the VCSEL may therefore be adapted to the ambient temperature during particle detection. The ambient temperature may be determined by way of the particle detector or may be taken from external information sources like, for example, temperature data of a given location available by way of a communication channel.

The range of drive currents may be further determined as a function of operating temperature of the particle detector. The drive current for particle detection is chosen depending on an operating temperature during particle detection. The operating temperature of the particle detector and especially the operating temperature of the VCSEL comprised by the particle detector may determine the noise measure at a given driving current. The range of drive currents may therefore be determined for different operating temperatures and corresponding measurement data may be stored in a storing device of the particle detector. The drive current of the VCSEL may be adapted to the operating temperature of the particle detector and especially the VCSEL during or directly prior to particle detection. The operating temperature may be determined by way of a temperature sensor of the particle detector. A known relationship between ambient temperature and operating temperature may be used such that optionally only one dependence of the noise measure may be determined. The range of drive currents and the drive current for particle detection may be determined in a factory and the particle detector may be calibrated for the respective drive current or drive currents in case of different drive currents for different ambient or operating temperatures. The calibration may take into account that the operating temperature may depend on the drive current.

The method described above may comprise the additional steps of: detecting a trigger event during operation of the particle detector, determining (optionally after detecting the trigger event) the noise measure of the intensity signal in the laser cavity of the optical wave within the laser cavity of the laser during operation of the particle detector, determining a new range of drive currents if the noise measure during operation of the particle detector exceeds an operation threshold, and determining at least a part of the operation conditions of the particle detector by choosing a new drive current for particle detection out of the determined new range of drive currents.

The optimum operation conditions especially the optimum drive current may, for example, change during lifetime of the particle detector. The method of determining the operation conditions as described above may therefore be performed after detection of a trigger event. The trigger event may be related to the performance or reliability of the particle detector.

The trigger event may be, for example, detecting that a signal-to-noise ratio of a self-mixing interference signal in the laser cavity of the optical wave within the laser cavity of the laser during operation of the particle detector is below a signal-to-noise ratio threshold. The signal-to-noise ratio of the self-mixing interference signal which is used to determine the particles especially the particle density may continuously be monitored in order to determine the performance and reliability of the particle detector or particle detection module.

Alternatively, the intensity signal and a corresponding noise measure may be determined at the drive current of the particle detector in order to provide a trigger event for starting the method of determining the operation conditions of the particle detector and especially the VCSEL. The trigger event may in this case be identical with determining the noise measure.

The trigger event may alternatively or in addition be switching on the particle detector and/or expiration of a predetermined time period. The trigger event is in these cases independent from determining the noise measure which is performed in a subsequent step.

The method may comprise the additional step of: starting a calibration procedure of the particle detector at the new drive current.

Sensitivity and count rate may depend on the operation conditions of the laser-based particle detector and especially the VCSEL comprised by the particle detector. It may therefore be preferred to calibrate the particle detector after choosing a drive current out of the determined range of drive currents. The latter may especially be important if the operation conditions are determined during operation of the particle detector after detection of a trigger event as described above.

A potential calibration procedure may be to perform a particle measurement and entering a reference value. The reference value may, for example, be taken from publicly available information as, for example, measurement results of other sensors (especially professional equipment) for a given location. Another option may be the measurement of, for example, reference particle densities. The reference particle densities may be provided in closed containers which may optionally comprise an interface to couple the container to a corresponding interface of the particle detector.

According to a further aspect, a laser-based particle detector for detecting a particle density of particles with a size of less than 20 µm, preferably less than 10 µm in a fluid is provided. The particle detector comprises a laser. The laser is a multimode Vertical Cavity Surface Emitting Laser. The particle detector further comprises an electrical driver for providing a drive current to the laser. The particle detector further comprises a detector coupled to the laser for determining a self-mixing interference signal of an optical wave within a laser cavity of the laser. The particle detector further comprises a controller. The controller is arranged to provide control signals to control the electrical driver to vary a drive current of the laser within a predefined range of drive currents. The controller is further arranged to determine a noise measure of an intensity (noise) signal in the laser cavity as a function of the drive current based on measurement signals provided by the detector. The controller is further arranged to determine a range of drive currents in which the noise measure is below a predefined threshold value (low noise range). The controller is further arranged to select a new drive current for particle detection out of the determined range of drive currents. The controller is further arranged to control the electrical driver to provide the new drive current during operation of the particle detector.

The controller may be arranged to determine a signal-to-noise ratio of the self-mixing interference signal determined by the detector during operation of the particle detector. The controller is further arranged to provide the control signals to control the electrical driver to vary the drive current of the laser if the signal-to-noise ratio is below a signal-to-noise ratio threshold during operation of the particle detector.

The controller may be further arranged to initiate a calibration procedure as described above after controlling the electrical driver to provide the new drive current during operation of the particle detector.

The VCSEL of the particle detector may be preferably characterized by weak optical guiding in order to provide a broad range of drive currents without or essentially without high intensity signals related to substantial noise measure. The VCSEL may, for example, be characterized by an (active) aperture diameter between 5 µm and 7 µm. The VCSEL may alternatively or in addition be characterized in that an interface between a semiconductor surface of an outcoupling surface of the VCSEL is out of an anti-node of a standing wave pattern of the VCSEL by at least 20 nm.

An air purifier, an exhaust hood, a car, a sensor box or a wearable device like a mobile communication device and alike may comprise the particle detector according to any embodiment as described above.

According to a further aspect a computer program product is presented. The computer program product comprises code which can be saved on at least one memory device of the particle detector or on at least one memory device of a device comprising the particle detector. The code configured such that the method according to any embodiment described above can be executed by at least one processing device of the particle detector or by at least one processing device of the device comprising the particle detector.

The memory device or the processing device may be comprised by the particle detector (e.g. electrical driver, controller etc.) or the device comprising the particle detector. A first memory device and/or first processing device of the device comprising the particle detector may interact with a second memory device and/or second processing device comprised by the particle detector.

The memory device or devices may be any physical device being arranged to store information especially digital information. The memory device may be especially selected out of the group solid-state memory or optical memory.

The processing device or devices may be any physical device being arranged to perform data processing especially processing of digital data. The processing device may be especially selected out of the group processor, microprocessor or application-specific integrated circuit (ASIC).

Various embodiments of the invention will now be described by way of the Figures.

Self-mixing interference is used for detecting movement of and distance to an object. Background information about self-mixing interference is described in "Laser diode self-mixing technique for sensing applications", Giuliani, G.; Norgia, M.; Donati, S. & Bosch, T., Laser diode self-mixing technique for sensing applications, Journal of Optics A: Pure and Applied Optics, 2002, 4, S. 283-S. 294 which is incorporated by reference. Detection of movement of a fingertip relative to a sensor in an optical input device is described in detail in International Patent Application No. WO 02/37410 which is incorporated by reference. The principle of self-mixing interference is discussed based on the examples presented in International Patent Application No. WO 02/37410. A diode laser having a laser cavity is provided for emitting a laser, or measuring beam. At its upper side, the device is provided with a transparent window across which an object, for example a human finger, is moved. A lens is arranged between the diode laser and the window. This lens focuses the laser beam at or near the upper side of the transparent window. If an object is present at this position, it scatters the measuring beam. A part of the radiation of the measuring beam is scattered in the direction of the illumination beam and this part is converged by the lens on the emitting surface of the laser diode and re-enters the cavity of this laser. The radiation re-entering the cavity of the diode laser induces a variation in the gain of the laser and thus in the intensity of radiation emitted by the laser, and it is this phenomenon which is termed the self-mixing effect in a diode laser.

The change in intensity of the radiation emitted by the laser or of the optical wave in the laser cavity can be detected by a photo diode or a detector arranged to determine an impedance variation across the laser cavity. The diode or impedance detector converts the radiation variation into an electric signal, and electronic circuitry is provided for processing this electric signal.

The self-mixing interference signal may in case of particle detection, for example, be characterized by a short signal burst or a number of signal bursts. The Doppler frequency as observed in these signals is a measure for the particle velocity along the optical axis. It may therefore be preferred to use a DC drive current in order to simplify signal detection and signal analysis. A modulated drive current may be used in order to determine the position or velocity of the particle, for example, by way of self-mixing interference signals which may be generated by reflection of laser light at bigger particles or disturbing objects. The distance (and optionally velocity) may be determined within one measurement or in a subsequent measurement step. It may therefore be possible or even beneficial to use a DC drive current in a first period in time in order to generate a particle measure of the intended particle number, velocity and a modulated drive current in a second period in order to determine false objects in the beam. The duration and the intensity of the signal may optionally be used to determine the particle size.

FIG. 1 shows a principal sketch of a particle detector 200. The particle detector 200 comprises a laser 111. The laser 111 is a multimode VCSEL. The VCSEL is arranged to emit the laser beam 112 in reaction to a drive current provided by electrical driver 130. Self-mixing interference signals may be generated after reflecting the laser beam 112 by a particle comprised by a particle flow, for example, parallel to a surface of the particle detector 200. The self-mixing interference signals are detected by a detector 121 which is in this case a photodiode integrated in the semiconductor layer structure of the VCSEL. The integrated photodiode determines variations of the optical wave within the laser cavity of the VCSEL caused by self-mixing interference of the optical wave within the laser cavity with reflected light of the laser beam 112. Electrical detection signals caused by the self-mixing interference signal in the laser cavity are transferred from the detector 121 to controller 150. The controller 150 evaluates the electrical detection signals and provides measurement signals related to the particles crossing the laser beam 112. The measurement signals may comprise a particle density of the particles or raw data which can be used to determine the particle density. The measurement signals generated by the controller 150 may be exchanged via an interface 135. The measurement signals may, for example, be transferred to an external computing device performing further data analysis based on the measurement signals. The common interface 135 may in addition be used to transfer electrical power to the particle detector 200. Alternatively different interfaces may be used to exchange electrical power and measurement signals. The particle detector may alternatively or in addition comprise a user interface to present measurement results which are generated based on the measurement signals. The laser beam 112 may be static or movable, for example, by a movable mirror (not shown) comprised by the particle detector 200. The particle detector 200 may optionally comprise further optical elements or devices to manipulate and especially focus the laser beam 112.

The controller 150 comprises a processor or microprocessor and a corresponding memory. The controller 150 is arranged to determine a signal-to-noise ratio of the self-mixing interference signal determined by the detector 121 during operation of the particle detector 200. The controller 150 provides control signals to control the electrical driver 130 to vary a drive current of the VCSEL within a predefined range of drive currents if the signal-to-noise ratio during operation of the particle detector 200 is below a signal-to-noise ratio threshold. The controller 150 determines a noise measure of an intensity signal in the laser cavity as a function of the drive currents based on the electrical detection signals provided by the detector 121. The controller 150 determines a range of drive currents in which the noise measure is below a predefined threshold value (signal-to-noise ratio above signal-to-noise ratio threshold). The controller 150 selects a new drive current for particle detection out of the determined range of drive currents. The controller 150 controls the electrical driver 130 to provide the new drive current during operation of the particle detector 200. The particle detector 200 is therefore adapted to determine whether the drive current provided by the electrical driver 130 drives the VCSEL, for example, in a range of a mode hop as discussed with respect to FIG. 2. The particle detector 200 determines in this case alternative driving conditions in order to provide reliable measurement signals.

Figure 2:
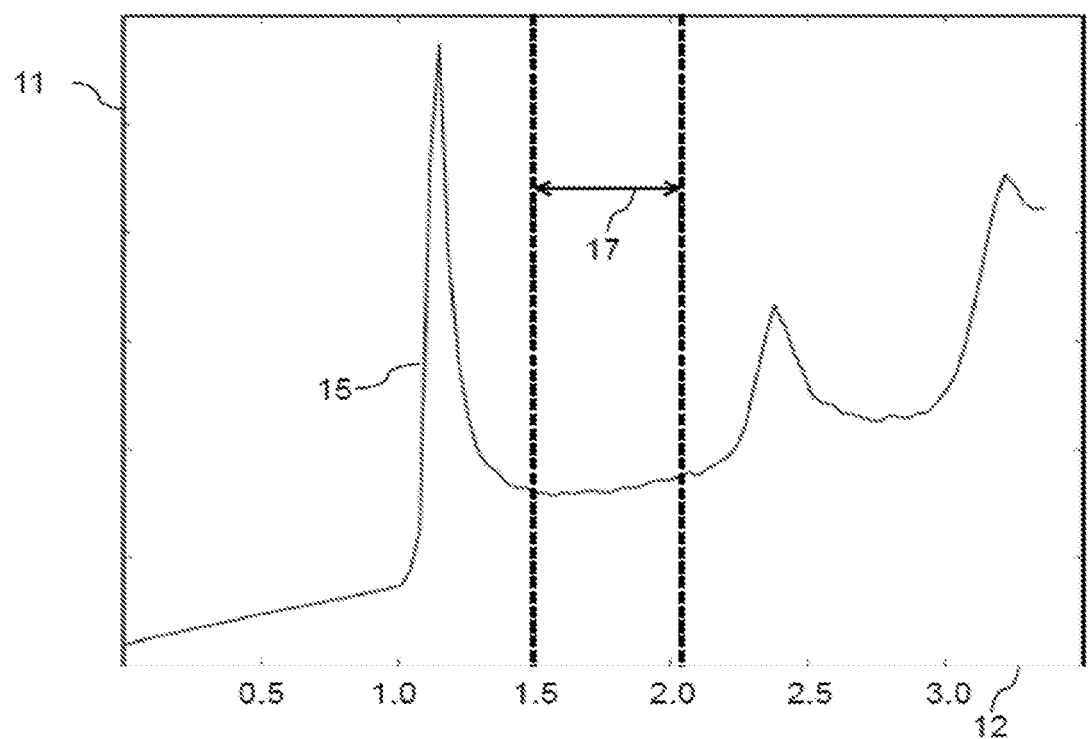
FIG. 2 shows a measurement of noise versus laser current of a multimode VCSEL.

FIG. 2 shows a measurement of noise 11 versus laser driving current 12 of a multimode VCSEL. The multimode VCSEL is characterized by a wavelength shift of $\Delta \lambda / \Delta I \sim 0.3$ nm/mA. The first peak of the measured intensity noise 15 at about 1.2 mA indicates the onset of laser operation on the mode with lowest losses. The peaks at higher currents (~2.4 mA and ~3.3 mA) coincide with the thresholds for higher modes. Suitable ranges for SMI-based particle detection are, for example, between 1.5 and 2.1 mA or between 2.6 and 3.0 mA. The preferred range of drive currents 17 indicated by the lines and the double arrow between 1.5 and 2.1 mA is where the VCSEL is driven in the fundamental mode.

Figure 3:
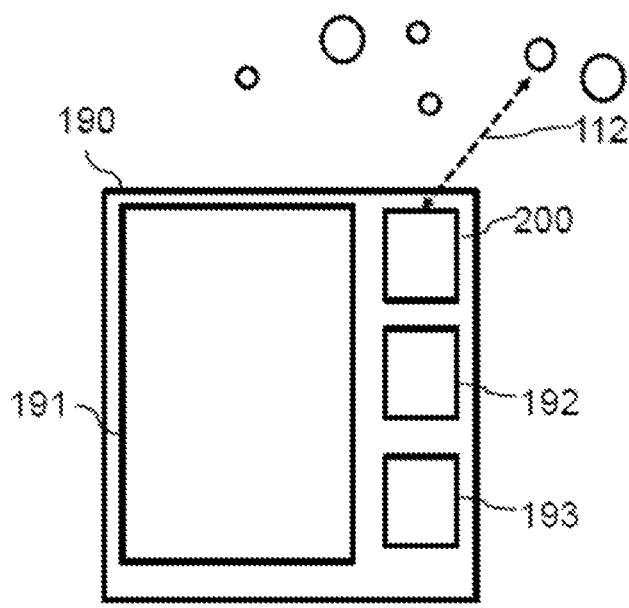
FIG. 3 shows a principal sketch of a mobile device comprising a particle detector.

FIG. 3 shows a principal sketch of a mobile communication device 190 comprising a particle detector 200. The particle detector 200 is adapted to emit a laser beam 112 as discussed with respect to FIG. 1 above. The mobile communication device 190 comprises a user interface 191, a main processing device 192 and a main memory device 193. The main processing device 192 is connected with the main memory device 193 and with the particle detector 200. The main processing device 192 evaluates measurement signals provided by controller 150. The main processing device 192 stores data related to particle detection in the main memory device 193. The main processing device 192 and the main memory device 193 are in this embodiment only used to prepare or adapt data provided by the particle detector 200 such that the data can be presented to a user of the mobile communication device 190 via user interface 191. The particle detector 200 may be powered by a power supply (not shown) of the mobile communication device 190. The main processing device 192 and the main memory device 193 may in an alternative embodiment perform part of the functionalities of controller 150.

The same principle may be used in other devices comprising the particle detector 200.

Figure 4:
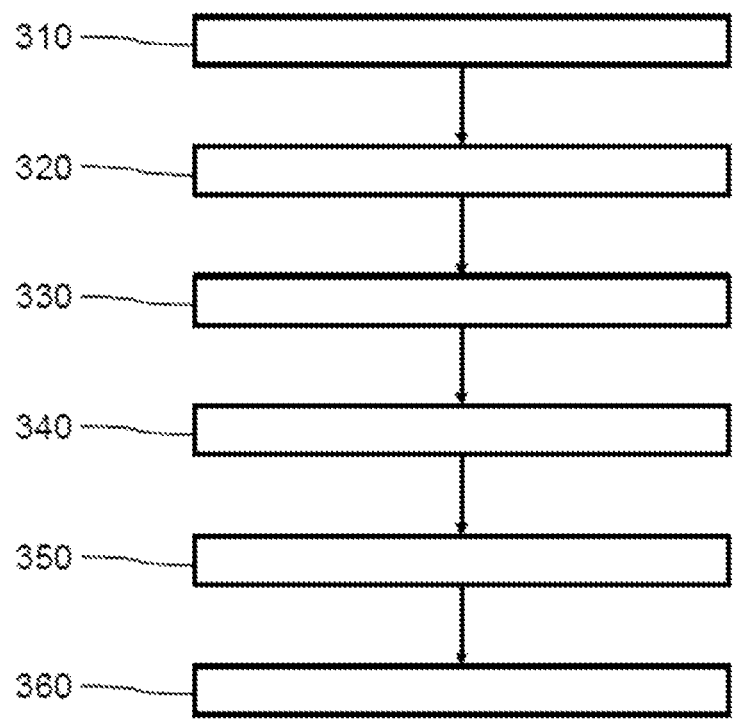
FIG. 4 shows a principal sketch of a method of determining operation conditions of a particle detector.

FIG. 4 shows a principal sketch of a method of determining operation conditions of a particle detector 200. An electrical drive current is provided in step 310 to the laser (VCSEL) such that a laser beam is emitted by the laser. The drive current is varied in step 320 within a predefined range of drive currents. An intensity signal of an optical wave within a laser cavity of the laser is determined as a function of the drive current in step 330 and a noise measure of the intensity signal is determined as a function of the drive currents in step 340. In step 350 is a range of drive currents determined in which the noise measure is below a predefined threshold value. At least a part of the operation conditions of the particle detector is determined in step 360 by choosing a drive current for particle detection out of the determined range of drive currents.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE NUMERALS 11 intensity noise
12 driving current
15 measured intensity noise
17 preferred range of drive currents
111 laser
112 laser beam
121 detector
130 electrical driver
135 interface
150 controller
190 mobile communication device
191 user interface
192 main processing device
193 main memory device
200 particle detector
310 step of providing electrical drive current
320 step of varying drive current
330 step of determining intensity signal
340 step of determining noise measure
350 step of determining range of drive currents
360 step of choosing drive current

The invention claimed is:

1. A method for determining operating conditions of a particle detector for detecting a particle density of particles with a size of less than 20 μm in a fluid, wherein the particle detector include a multimode Vertical Cavity Surface Emitting Laser (VCSEL), the method comprising:
providing an electrical drive current to the multimode VCSEL such that a laser beam is emitted by the multimode VCSEL;
varying the electrical drive current within a predefined range of electrical drive currents;
determining, as a function of the electrical drive current, an intensity signal of an optical wave within a laser cavity of the multimode VCSEL;
determining, as a function of the electrical drive current, a noise measure of the intensity signal;
determining a range of electrical drive currents for which the noise measure is below a predefined threshold noise measure value;
determining at least a part of the operating conditions of the particle detector by choosing an electrical drive current for particle detection out of the determined low noise range of electrical drive currents,
detecting a trigger event during operation of the particle detector;
determining the noise measure of the intensity signal of the optical wave within the laser cavity of the multimode VCSEL during operation of the particle detector;
determining a new range of electrical drive currents if the noise measure of the intensity signal of the optical wave within the laser cavity during operation of the particle detector exceeds an operating threshold,
determining at least a part of the operating conditions of the particle detector by choosing, from the new range of electrical drive currents, a new electrical drive current for particle detection.

2. The method according to claim 1, wherein the range of electrical drive currents is further determined as a function of ambient temperature, and wherein the electrical drive current for particle detection is chosen depending on an ambient temperature during particle detection.

3. The method according to claim 1, wherein the range of electrical drive currents is further determined as a function of operating temperature of the particle detector, and wherein the electrical drive current for particle detection is chosen depending on an operating temperature during particle detection.

4. The method according to claim 1, wherein the trigger event is detection of a signal-to-noise ratio of a self-mixing interference signal in the laser cavity of the optical wave within the laser cavity of the multimode VCSEL during operation of the particle detector below a signal-to-noise ratio threshold.

5. The method according to claim 1, wherein the trigger event is switching on the particle detector.

6. The method according to claim 1, wherein the trigger event is expiration of a predetermined time period.

7. The method according to claim 1, further comprising starting a calibration procedure of the particle detector at the new electrical drive current.

8. A computer program product comprising computer executable code stored on at least one memory device, wherein the computer executable code includes instructions for carrying out the method according to claim 1.

9. A particle detector for detecting a particle density of particles with a size of less than 20 μm in a fluid, the particle detector comprising:
a laser;
an electrical driver configured to provide a drive current to the laser,
a detector coupled to the laser and configured to determine a self-mixing interference signal of an optical wave within a laser cavity of the laser; and
a controller,
wherein the laser is a multimode Vertical Cavity Surface Emitting Laser (VCSEL),
wherein the particle detector is configured to determine a trigger event,
wherein the controller is configured to provide control signals to control the electrical driver so as to vary a drive current of the laser within a predefined range of drive currents after detection of the trigger event,
wherein the controller is further configured to determine a noise measure of an intensity signal in the laser cavity as a function of the drive current based on detection signals provided by the detector, wherein the controller is further configured to determine a range of drive currents in which the noise measure is below a predefined threshold value, wherein the controller is further configured to select a drive current for particle detection out of the determined range of drive currents, and wherein the controller is further configured to control the electrical driver to provide the drive current during operation of the particle detector.

10. A particle detector according to claim 9, wherein the controller is configured to determine a signal-to-noise ratio of the self-mixing interference signal determined by the detector during operation of the particle detector, and wherein the controller is further configured to provide the control signals to control the electrical driver to vary the drive current of the laser if the signal-to-noise ratio during operation of the particle detector is below a signal-to-noise ratio threshold.

11. The particle detector according to claim 9, wherein the controller is further configured to initiate a calibration procedure after controlling the electrical driver to provide the drive current during operation of the particle detector.

12. The particle detector according to claim 9, wherein the VCSEL has an aperture with a diameter between 5 μm and 7 μm.

13. The particle detector according to claim 9, wherein an interface between a semiconductor surface of an outcoupling surface of the VCSEL is out of an anti-node of a standing wave pattern of the laser by at least 20 nm.

14. A mobile communication device comprising the particle detector according to claim 9.

* * * * *